United States Patent [19]

Fagan et al.

[11] 4,103,344

[45] Jul. 25, 1978

[54] METHOD AND APPARATUS FOR ADDRESSING A NON-VOLATILE MEMORY ARRAY

[75] Inventors: John Lee Fagan, Pasadena; Marvin Hart White, Laurel; Donald Ross Lampe, Elicott City, all of Md.

[73] Assignee: Westinghouse Electric Corp., Pittsburgh, Pa.

[21] Appl. No.: 653,760

[22] Filed: Jan. 30, 1976

[51] Int. Cl.² ............................................. G11C 11/40
[52] U.S. Cl. ..................................... 365/184; 365/230; 365/240
[58] Field of Search ..................... 340/173 R, 173 CA; 365/184, 185

[56] References Cited

U.S. PATENT DOCUMENTS

| 3,720,922 | 3/1973 | Kosonocky | 340/173 R |
| 3,728,695 | 4/1973 | Bentchkowsky | 340/173 R |
| 3,851,317 | 11/1974 | Kenyon | 307/238 X |
| 3,914,750 | 9/1975 | Hadden | 340/173 R |

Primary Examiner—Bernard Konick
Assistant Examiner—Donald McElheny
Attorney, Agent, or Firm—H. W. Patterson

[57] ABSTRACT

A method and apparatus for charge addressing a non-volatile MNOS memory cell in a LSI array of memory cells, is disclosed. Each MNOS cell of the array is made up of a substrate; adjacent diffusion areas in the substrate; a memory window intermediate the adjacent diffusion areas, controlled by a memory gate; and an enable gate adjacent the memory window and overlapping one of the diffusion areas. The memory gate and the enable gate are each separated from the substrate and each other by silicon dioxide/silicon nitride layers to provide a capacitive dielectric. Addressing of an individual cell in the array is achieved by selective activation of a corresponding enable gate and a corresponding memory gate, which are formed in an orthogonal grid array. The cell is accessed by a single stage of a shift register for both read and write operations through a transfer gating means.

16 Claims, 5 Drawing Figures

METHOD AND APPARATUS FOR ADDRESSING A NON-VOLATILE MEMORY ARRAY

BACKGROUND OF THE INVENTION

1. Field of the Invention

The present invention relates to an improved method and apparatus for selectively charge addressing individual MNOS memory cells of an MNOS transistor array.

2. State of the Prior Art

In the prior art, conventional single gate MNOS memory cells are employed and individually read by use of a current-sense flip-flop circuit, as is typically shown in FIG. 1. The flip-flop circuit 10 is conventional and, for illustration purposes, comprises transistors 1, 3, 5 and 7. The flip-flop circuit 10 is initially set so that both sides are at substrate voltage $V_s$ by an initiate signal $I_s$ applied to transistors 3 and 5, turning them on. When the MNOS cell 2 is to be read, the transistors 3 and 5 are turned off by the initiate signal $I_s$ and the flip-flop circuit 10 enters a "race" condition to determine which side of the flip-flop circuit 10 will first provide the current sufficiently large to set the opposite side in a "1" state. A reference transistor 4, having its gate connected to a reference voltage $V_D$, is connected to one side of the flip-flop circuit. The other side of the flip-flop circuit is connected to the MNOS memory cell while a read voltage $V_M$ is applied thereto. Thus, the memory cell current competes with the reference transistor current. A transfer signal applied to a transfer gate 6 provides access to a stage of a parallel-in shift register 15. The sensing of the MNOS cell 2 against the reference transistor 4 is performed in the source-follower mode, which is characterized by a relatively slow decision speed. The operation of the prior art circuit shown in FIG. 1 is critically dependent upon the adjustment of the "current window" which may be controlled by an adjustment of the reference signal voltage $V_D$. Unfortunately, the required reference signal voltage may be different for each memory cell and a single reference supply is often not sufficient to similarly adjust the "current window" across a large array of memory cells.

In addition to the problems recited above, a more serious problem is encountered when high density arrays are required. In general, as the memory array size and cell density increases, the dimensions of the memory cell decreases and the drive current capacity of the memory cell becomes smaller, thereby increasing the time required to charge the capacitance C of the columns. Therefore, the prior art technique shown in FIG. 1, for reading a memory cell, has an access time to first bit which increases as the memory array size increases or the memory cell size decreases. It is seen as a near impossibility to implement the prior art memory array and read out system on a LSI chip of 16K bit or greater, since the flip-flop circuits must be placed on the pitch of the memory array.

SUMMARY OF THE INVENTION

In attempting to overcome the problems of the prior art readout techniques for LSI MNOS memory arrays, wherein high density (>16K bits) require memory cell sites <0.5mil²/bit, and preferably <0.25mil²/bit, the present invention was discovered. The present invention employs a high density array of MNOS transistor cells which are each characterized by a single diffusion region and a plurality of control gates. Each memory cell is also characterized as being in a high threshold state or a low threshold state. The memory cells are selectively addressed for either read or write operations directly from a parallel-in shift register which may be a conventional Dynamic Ratioless type. A plurality of clockpulse phases are employed to shift data in the parallel-in shift register and also to provide for multiple shift register access to the memory array.

It is an object of the present invention to provide a novel MNOS memory array which provides for high density packing.

It is another object of the present invention to eliminate the conventional flip-flop detection circuitry used to sense current flow in a MNOS memory cell.

It is still another object of the present invention to provide a novel method of addressing an MNOS memory cell in a high density array.

It is a further object of the present invention to provide a novel method of reading the threshold level of addressed memory cells in a high density LSI array.

It is a still further object of the present invention to reduce the number of geometric entities employed to produce a high density array of memory cells.

It is a still further object of the present invention to provide an array of MNOS memory cells, each of which utilize diffusion regions common to other memory cells.

DETAILED DESCRIPTION OF THE PREFERRED EMBODIMENT

Figure 1:
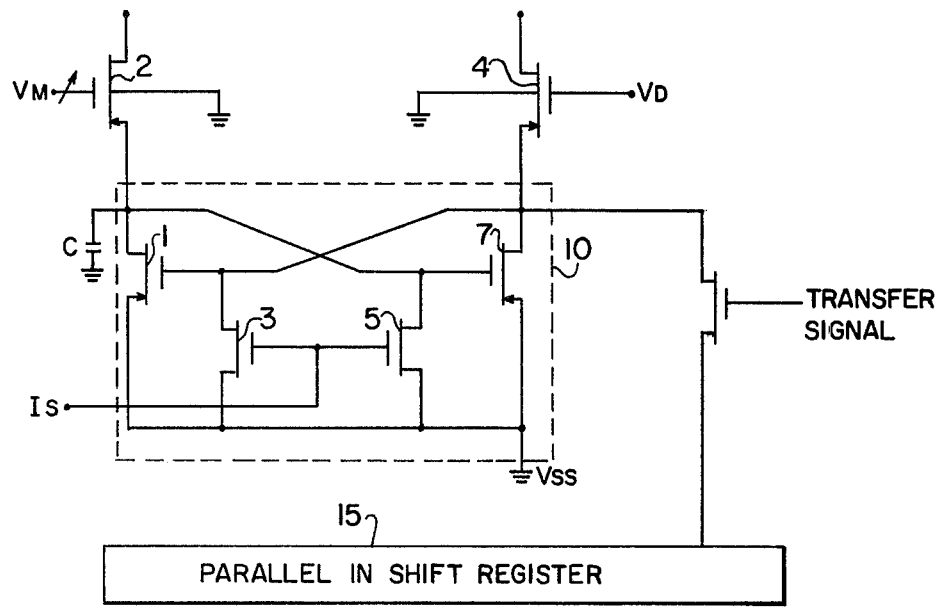
FIG. 1 shows a prior art method of addressing a single gate MNOS memory cell by use of a current-sensing flip-flop circuit.
Figure 2:
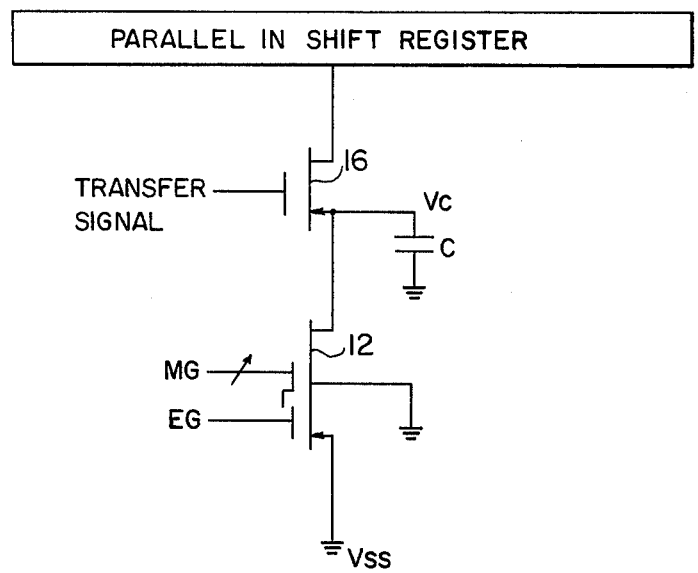
FIG. 2 is a circuit diagram indicating a method of charge addressing a MNOS memory transistor of the present invention.

A method of charge addressing a MNOS memory cell of the present invention is illustrated in the circuit diagram of FIG. 2. In this method, the multigated MNOS memory cell 12 is "read" after the column capacitance C is charged to a specific reference voltage $V_R$. Then, after the column capacitance C is preset, "read" signals are applied to the address gates of the memory cell 12. The memory cell 12, which has been addressed with "read" signals will cause the charge stored in the capacitor C to discharge, from the drain to the source, if the memory cell is in a low threshold state. Alternatively, if the addressed memory cell 12 is in a high threshold state, the charge $V_C$ stored in the capacitor C will be maintained since no discharge will occur from the drain to the source. Subsequently, the transfer switch 16 is addressed and the remaining charge stored in the capacitor C is sensed in the shift register 15, to thereby read the threshold state of the memory cell 12. It has been found in the read mode, that the discharge of the capacitor C through the memory cell 12 occurs more rapidly when the memory cell is in the drain follower configuration, as is shown in FIG. 2, than in the source follower configuration.

The above method of addressing a MNOS memory cell transistor is a significant improvement over the prior art, since it eliminates the flip-flop circuitry employed by the prior art and increases the achievable density due to the array layout of the MNOS cells, discussed below.

Figure 3A:
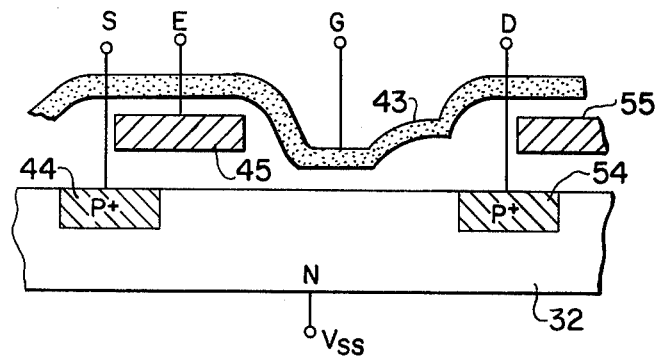
FIG. 3A is a cross-sectional view of a single MNOS memory cell of the memory cell array employed in the present invention.
Figure 3B:
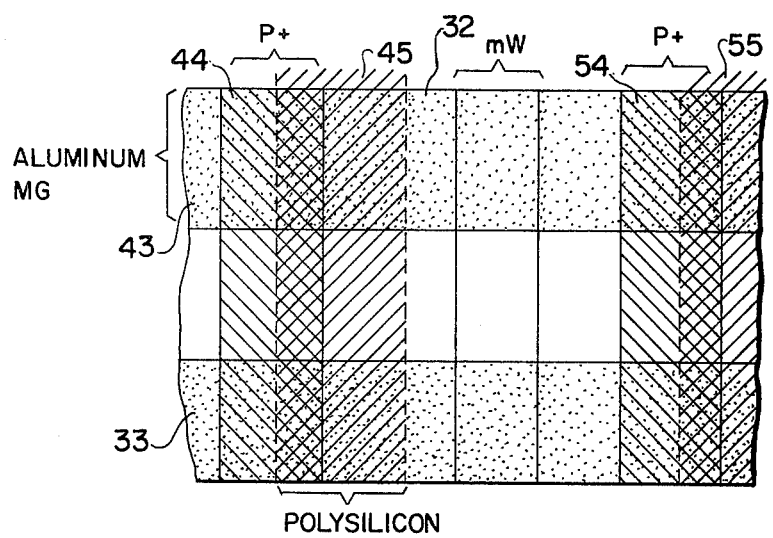
FIG. 3B is a top view of the single MNOS memory cell shown in FIG. 3A.

FIGS. 3A and 3B illustrate a single MNOS transistor memory cell of an array of such cells, similar to those in commonly assigned copending U.S. patent application Ser. No. 653,849, filed on Jan. 30, 1976, entitled ADDRESSABLE MNOS CELL FOR NON-VOLATILE MEMORIES.

The principle features of a unit cell are given by example as a single channel of 4μm wide P+ diffusion region per memory column, a 6μm wide polysilicon enable gate, and a 10μm wide memory gate controlling a 4μm wide memory window offset from the P+ diffusion.

The array of MNOS transistors are formed on a substrate 32, which is of a material having a given conductivity type of, for example, N-type Si. Columns of diffusion regions of the opposite conductivity type, for example, P+ are formed on the substrate 32 and indicated as 44, 54, . . . , etc. Polysilicon enable gates 45, 55, . . . , etc., parallel and corresponding to each diffusion area are formed above the substrate 32 separated by a dielectric material. Each enable gate overlaps the corresponding diffusion area and an adjoining portion of the surface of the substrate 32. Aluminum memory gates 33, 43, . . . , etc. extend orthogonally to the diffusion areas and the polysilicon gates, controlling memory windows mW defined between each diffusion area, wherein the intersections of said aluminum memory gates and said memory windows define a non-volatile discrete charge storage site at each occurrance.

A single transistor cell, as shown in FIG. 3A, of the array shown in FIG. 3B is defined by two adjacent diffusion areas 44 and 54, which are each common to other cells, in the same and adjoining columns; a memory window mW, controlled by a specific memory gate 43, which is common to other cells along that column; and a polysilicon enable gate 45, corresponding to the selected diffusion region 44 and overlapping in the direction of the selected memory window. The enable gate 45 is also common to other cells in the same column. In the example shown in FIG. 3A, diffusion region 54 is designated as the drain and diffusion region 44 is designated as the source, while the intersecting memory gate 43 controls a memory window mW between the respective drain and source. It should be understood that the roles of the diffusion areas may be interchanged as operations require.

The MNOS memory cell shown in FIGS. 2, 3A and 3B is capable of either high or low threshold states, and may enter the high threshold state during the "write" operation. In the illustrated example, during the "write" operation, the diffusion 44 is disabled by the polysilicon enable gate 45 at substrate voltage and a "write" voltage of −25 volts is applied to memory gate 43 creating a depletion region beneath the memory window mW. Data from the shift register is transferred to the diffusion 54 upon the command of a transfer signal. If the data is high (substrate voltage), minority charge is injected into the depletion region created in the substrate at the memory window. The depletion region therefore collapses to substrate voltage and the entire "write" voltage is dissipated across the dielectric at the memory window and charge tunneling occurs. The resulting charge storage in the dielectric leaves the cell in a high threshold state where $V_T \simeq -10$ volts.

Alternatively, if the write data from the shift register is low in a range of approximately −15V to −25V, there is no charge injection and the "write" voltage is dissipated over the depletion region. Therefore, when the data is low, no tunneling occurs and the cell remains in a low threshold state where $V_T \simeq -2$ volts.

Figure 4:
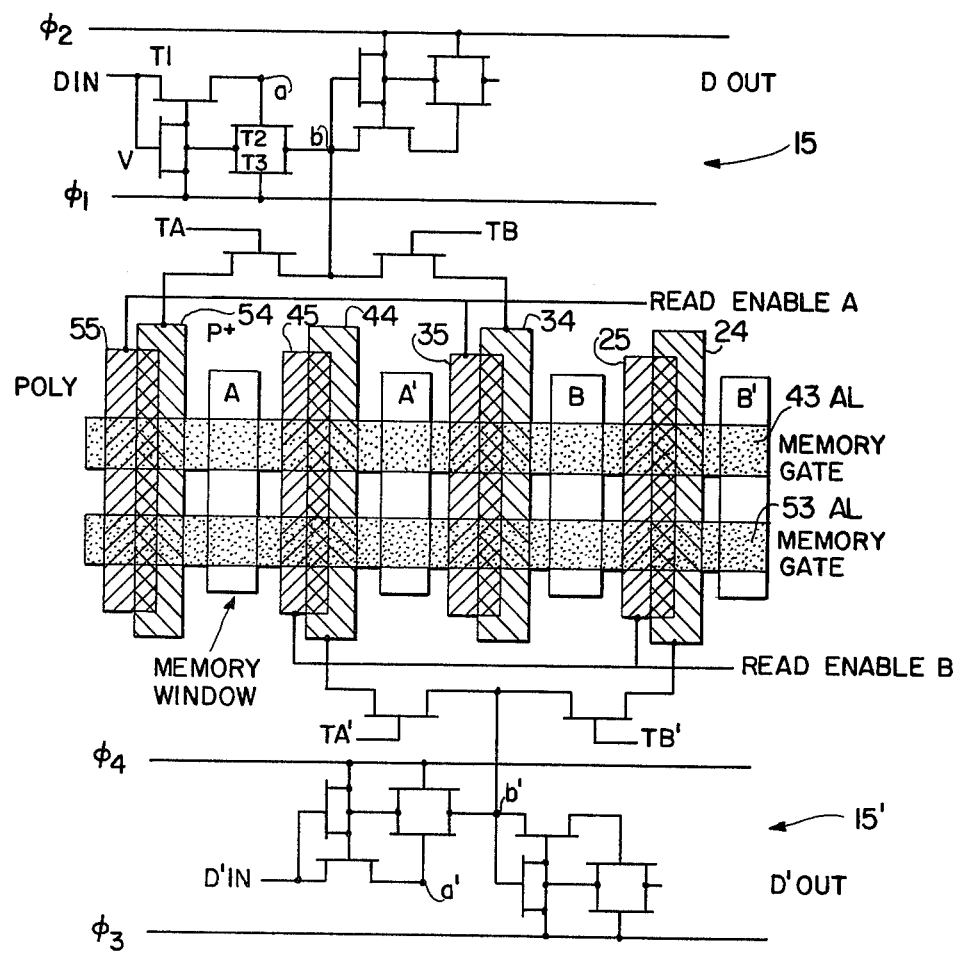
FIG. 4 is a detailed circuit diagram illustrating the charge addressing techniques employed in the present invention.

FIG. 4 shows a schematic diagram of a single stage of respective parallel shift registers 15 and 15', which are used to read and write data with respect to the correspondingly addressed MNOS memory cells. Since each of the shift registers 15 and 15' are identical, only the operation of the register 15 stage will be explained in detail.

Clock pulses $\phi 1$ and $\phi 2$ are used to shift data in the shift register 15, (clock pulses $\phi 3$ and $\phi 4$ are used in shift register 15') which comprises a transfer gate and an inverter corresponding to $\phi 1$ and a transfer gate and inverter corresponding to $\phi 2$, for each shift stage. During the time data is being shifted into the shift register 15, transfer gates TA and TB are disabled, thereby preventing unwanted communication between the shift register and the memory array. In this embodiment, when the $\phi 1$ clock pulse goes from a zero level first state to a negative level second state, data at the input mode $D_{IN}$ is transferred to a node "a" through a transfer device T1. A varactor V is provided in the shift register 15, since it acts to enhance negative data at the input node $D_{IN}$ and counter-balances the charge sharing that occurs between the input node $D_{IN}$ and the node "a". Simultaneously, a node "b" is charged to said negative state under the influence of the negative clock pulse $\phi 1$. The node "b" takes on the state of the clock pulse $\phi 1$, since $\phi 1$ turns on the transfer device T3. Clock pulse $\phi 1$ then goes to the zero level state, turning off transfer device T1 and thereby isolating node "a" from the input node $D_{IN}$. If the node "a" is negative, the transfer device T2 is on and causes the node "b" to discharge after clock pulse $\phi 1$ goes to the zero state. However, if node "a" is positive, transfer device T2 is off and node "b" remains negatively charged. Therefore, it can be seen that a single $\phi 1$ clock pulse causes the data to be transferred and inverted from the input node $D_{IN}$ to node "b". A second clock pulse $\phi 2$ causes the data stored at node "b" to be transferred to a subsequent node in identical fashion to that recited above. Data is then continually shifted along the shift register 15 for a predetermined number of clock pulses as is desired for a particular operation.

The capacitance associated with node $a$ is comprised of diffusion capacitance of the transistor T1, the gate capacitance of interconnection capacitance for the aluminum connection between T1 and T2. No additional capacitance is needed for operation since node $a$ is a high impedance node when T1 transistor is not conducting. The only mechanism for losing charge (and thereby signal voltage) from node $a$ is the reverse biased leakage current of the T1 diffusion. With proper processing, node $a$ will hold sufficient charge for operation for several seconds at 25° C. Node $b$ operates in similar fashion, having the capacitance of 5 transistor diffusions, the varactor gate, and necessary interconnections. Other nodes in the circuit, for example, the p+ diffusions 54, 44, 34, and 24 are also operated in a manner which uses their inherent capacitance as a means of storing a signal voltage.

During a "write" operation, data enters the shift register 15 and is shifted to a desired position in the shift register by a predetermined number of clock pulses. On the negative transistion of the final $\phi 1$ clock pulse, a selected transfer gate, for example, TA is switched on by a transfer command signal. The effect of the clock pulse $\phi 1$ in the negative state, causes the correspondingly selected P+ diffusion region 54 to be charged negatively along with node "b". When final $\phi 1$ clock pulse returns positive, the data polarity at node "a" determines whether the P+ diffusion region 54 remains negatively charged or whether it will be returned positive along with node "b". After the clock pulse $\phi 1$ returns positive, a selected memory gate such as 43, is addressed with a "write" voltage of approximately $-25$ volts with all read/enable gates turned off. If the data applied to the P+ diffusion 54 from node "b" is at zero volts (positive with respect to said write voltage), the depletion region under the memory gate 43, corresponding to the memory window mW, is injected with minority carriers, thereby collapsing the surface potential at the memory window to 0V. The negative voltage applied to the memory gate as the "write" signal, causes charge tunneling to occur across the dielectric, thereby leaving the selected cell in a high threshold state.

If the diffusion region 54 is negative, corresponding to the node "b", minority carriers are not injected and the memory gate voltage is dissipated across the depletion region, thereby inhibiting tunneling and leaving said memory cell in a low threshold state.

It should be evident from the above, that for the "write" operation, the memory cell is not employed as a conventional MNOS transistor, since only a single diffusion area is used.

A "read" operation is performed on the selectively addressed memory cells by, for example, negatively precharging the capacitive node "b" and the selected P+ diffusion 54 through actuated transfer gate TA. The lower shift register 15' simultaneously sets the adjacent P+ diffusion 44 to 0 volts (substrate voltage) through transfer gate TA'. A "read" voltage is applied to the selected memory gate 43. The "read" voltage has a value intermediate of the high and low threshold values of the memory. Generally, a high threshold has a value of approximately $-10V$ and a low threshold has a value of apprximately $-2V$, while the read voltage is selected to have a value of approximately $-6V$. An appropriate enable gate is similarly activated (in this case, polygate 45) with a voltage more negative than the low threshold voltage and the charge at node "b" is either maintained at its initial level or is discharged to 0V (substrate voltage), depending upon the threshold state of the selected memory cell.

If a given memory cell is in its low threshold state, during the above "read" operation the memory transistor is ON and the data node "b" is discharged to 0 volts. Correspondingly, if the memory threshold is in its high state, the data node "b" remains charged negative. The threshold state of selectively addressed memory cells in a memory array are therefore rapidly and precisely read into the shift register without disturbing the threshold state of the address cell.

It will be apparent that many modifications and variations of the above favored embodiment may be effected without departing from the scope of the novel concept of this invention. Therefore, it is intended by the appended claims to cover all such modifications and variations which fall within the true spirit and scope of the invention.

What is claimed is:

1. A method of charge addressing a dual dielectric MNOS memory cell having diffusion regions which function as both source and drain regions having a corresponding plurality of gates, comprising the steps of:
   setting a charge in an interface between the two dielectrics of the charge storage device;
   providing a conducting path for said stored charge from said charge storage device to a diffusion region of said memory cell;
   activating said plurality of corresponding gates with predetermined voltages; and said corresponding plurality of gates comprise a memory gate and an enable gate adjacent each other, and said step of activating is performed by gating predetermined values of voltage with a predetermined relationship to said respective memory gate and enable gate to effect the dual source/drain function of the diffusion regions.

2. A method of charge addressing an MNOS memory cell as in claim 1, wherein said step of providing a conducting path is performed by turning on a transfer gate.

3. A method of charge addressing an MNOS memory cell as in claim 1, wherein said step of activating said plurality of corresponding gates is performed with values of voltage intermediate to the two possible threshold state values of said memory cell, and further including a step of reading said threshold state of said memory cell, whereby if said stored charge is discharged through said cell, said cell is read as in a first of said two possible threshold states and if said charge is not discharged, said cell is read as in a second of said two possible threshold states.

4. A method of charge addressing a dual dielectric MNOS memory cell having diffusion regions which function as both source and drain regions having a corresponding plurality of gates, comprising the steps of:
   setting a charge in a charge storage device;
   providing a conducting path for said stored charge from said charge storage device to a diffusion region of said memory cell;
   activating said plurality of corresponding gates, wherein said plurality of gates comprise a memory gate and an enable gate adjacent each other, with predetermined voltages with a predetermined relationship to effect the dual source/drain function of the diffusion regions; and
   said step of setting said charge is performed by gating data in a shift register connected to said provided conducting path.

5. A method of charge addressing an MNOS memory cell as in claim 4, wherein said step of providing a conducting path is performed by turning on a transfer gate.

6. A method of charge addressing an MNOS memory cell as in claim 5, wherein said corresponding plurality of gates comprise a memory gate and an enable gate adjacent each other, and said step of activating is performed by gating predetermined values of voltage to said respective memory gate and enable gate.

7. A method of charge addressing an MNOS memory cell as in claim 5, wherein said step of activating said plurality of corresponding gates is performed with values of voltage intermediate to the two possible threshold state values of said memory cell, and further including a step of reading said threshold state of memory cell, whereby if said stored charge is discharged through said cell, said cell is read as in a first of said two possible threshold states and if said charge is not discharged, said cell is read as in a second of said two possible threshold states.

8. An apparatus for charge addressing a dual dielectric MNOS memory cell having a plurality of corresponding gates and at least one diffusion, comprising:
means for storing a charge in a non-volatile static manner at the interface between the two dielectrics-dependencies;
means for setting a charge in said storage means;
means for providing a conducting path for said stored charge to said diffusion of said memory cell; and
means for activating said plurality of corresponding gates, each cell comprises a first and second diffusion, said plurality of corresponding gates comprise an aluminum memory gate controlling a memory window adjacent said first diffusion, and a polysilicon enable gate for controlling a region between said second diffusion and said memory window.

9. An apparatus for charge addressing an MNOS memory cell as in claim 8, wherein said storage means and said setting means are in a parallel shift register activated by a plurality of clock pulse phases to shift data therein, and said charge has a binary value.

10. An apparatus for charge addressing an MNOS memory cell as in claim 8, wherein said providing means is a transfer gate switch controlled by a data transfer signal, whereby said conducting path is provided from said storage means to said diffusion.

11. An apparatus for charge addressing an MNOS memory cell as in claim 8, wherein said activating means is defined as means for applying a read voltage to said memory gate and a predetermined voltage to said enable gate to read the binary threshold state of said memory cell, by monitoring said stored charge.

12. A non-volatile charge addressed memory cell array wherein each memory cell comprises:
a diffusion region, common to different cells of said array;
means for effecting use of said common region for the dual function of both a source and a drain;
an enable gate common to different cells of said array and overlapping said diffusion region;
a memory gate common to different cells of said array;
a memory window controlled by said memory gate; and
said array is formed on a substrate having a given conductivity type;
said diffusions are of an opposite conductivity type to the substrate and are formed in parallel columned alternate channels on a surface of said substrate;
said enable gate is of polysilicon and is formed in a column parallel to and in between and overlapping said diffusions;
said memory gate is of aluminum and is formed in a row orthogonal to said diffusions and said enable gate; and
said memory window is comprised of a silicon dioxidesilicon nitride dielectric.

13. A non-volatile charge addressed memory cell array as in claim 12, further including a shift register for communicating data to correspondingly addressed memory cells.

14. A non-volatile charge addressed memory cell array as in claim 12, further including a shift register for simultaneously writing a plurality of individual data into correspondingly addressed memory cells, wherein said memory cells are addressed by activating a corresponding enable gate and a corresponding memory gate.

15. A non-volatile charge addressed memory cell array as in claim 12, wherein said array comprises a plurality of enable gates parallel to said aforementioned enable gate and a plurality of memory gates parallel to said aforementioned memory gate.

16. A non-volatile charge addressed memory cell array as in claim 12, further including a shift register for reading the threshold level state of a plurality of individual and correspondingly addressed memory cells, wherein each of said memory cells are addressed by activating a corresponding enable gate and a corresponding memory gate with a predetermined voltage.

* * * * *